United States Patent
Taussig et al.

(10) Patent No.: US 6,817,531 B2
(45) Date of Patent: Nov. 16, 2004

(54) APPARATUS AND METHODS FOR MARKING CONTENT OF MEMORY STORAGE DEVICES

(75) Inventors: Carl P. Taussig, Redwood City, CA (US); Josh N Hogan, Los Altos, CA (US); Richard E Elder, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 46 days.

(21) Appl. No.: 09/800,559

(22) Filed: Mar. 7, 2001

(65) Prior Publication Data

US 2002/0126526 A1 Sep. 12, 2002

(51) Int. Cl.⁷ .............................................. G06K 19/06
(52) U.S. Cl. ....................................... 235/492; 235/494
(58) Field of Search ........................ 235/492, 494, 235/487, 488, 375, 376, 436; 365/96, 103, 105, 189.08, 191

(56) References Cited

U.S. PATENT DOCUMENTS

| | | | | |
|---|---|---|---|---|
| 3,611,319 A | * | 10/1971 | Gilbert ........................ 340/173 |
| 3,763,468 A | | 10/1973 | Ovshinsky et al. |
| 3,795,847 A | * | 3/1974 | Engeler et al. ............. 317/304 |
| 4,382,289 A | * | 5/1983 | Saitoh .......................... 365/96 |
| 4,729,030 A | * | 3/1988 | Glenn .......................... 358/230 |
| 4,922,319 A | * | 5/1990 | Fukushima .................. 357/51 |
| 5,034,736 A | * | 7/1991 | Bennett et al. ............. 340/784 |
| 5,049,728 A | * | 9/1991 | Rovin ......................... 235/492 |
| 5,761,655 A | * | 6/1998 | Hoffman ......................... 707/4 |
| 5,786,827 A | * | 7/1998 | Jukl et al. .................... 345/507 |
| 5,835,429 A | * | 11/1998 | Schwarz ...................... 365/201 |
| 5,905,670 A | * | 5/1999 | Babson et al. .............. 365/105 |
| 5,912,839 A | | 6/1999 | Ovshinsky et al. |
| 5,969,720 A | * | 10/1999 | Lisle et al. .................. 345/775 |
| 5,982,397 A | * | 11/1999 | Walsh ......................... 345/521 |
| 6,055,180 A | | 4/2000 | Gudesen et al. ............ 365/175 |
| 6,160,788 A | * | 12/2000 | Kobayashi et al. ......... 235/487 |
| 6,178,132 B1 | * | 1/2001 | Chen et al. ............ 365/230.02 |
| 6,185,122 B1 | | 2/2001 | Johnson et al. |

FOREIGN PATENT DOCUMENTS

EP          0291259          11/1988

* cited by examiner

Primary Examiner—Daniel St.Cyr

(57) ABSTRACT

An electrical marking device is disposed on at least one layer of a data storage array having multiple layers of data storage medium. The marking device comprises at least one display layer that may be visually altered to display information, such as the nature, subject matter, and content of the data and amount of memory storage used. The display layer comprises a plurality of data storage cells, wherein the visual appearance of each of the data storage cells is varied depending on the value of the data bit. A method is also provided for electrically marking the content of an electrical data storage device having a storage array unit with multiple layers of data storage medium. Data is stored on an outermost layer of the data storage array to electrically provide a visual display indicating information about the stored data.

21 Claims, 6 Drawing Sheets

APPARATUS AND METHODS FOR MARKING CONTENT OF MEMORY STORAGE DEVICES

BACKGROUND OF THE INVENTION

1. Field of the Invention

The present invention pertains to the field of digital memory circuits. More particularly, this invention relates to providing an information storage unit having electrical marking for providing information, such as the content of the data stored in the information storage unit.

2. Background

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 10 MB to hundreds of gigabytes (GB). The storage memory should also be low in power consumption (e.g. <<1 Watt) and have relatively rugged physical characteristics to cope with the portable battery powered operating environment. For archival storage, data need only be written to the memory once. Preferably the memory should have a short access time (in the order of milliseconds) and moderate transfer rate (e.g. 20 Mb/s). Preferably, also, the storage memory should be able to be packaged in an industry standard interface module, such as PCMCIA or Compact Flash card.

One form of write-once compact information storage is shown in U.S. Pat. No. 6,055,180, granted to Gudesen et al. on Apr. 25, 2000, in which matrices of individually addressable cells are provided in layers between orthogonally arranged conductors. The cells may be comprised of cross-point diodes, OLEDs, bistable liquid crystal elements or other devices that change state with the introduction of heat and/or light.

Another application in portable devices for providing high density archival storage is described in assignee's U.S. Pat. No. 6,646,912 filed Jun. 5, 2001, entitled "Non-Volatile Memory," the disclosure of which is hereby incorporated herein by reference. The memory system disclosed therein, referred to as portable inexpensive rugged memory (PIRM), aims to provide high capacity write-once memory at low cost for archival storage. This is realized in part by avoiding silicon substrates, minimizing process complexity and lowering areal density. The memory system includes a memory module formed of a laminated stack of integrated circuit layers constructed on plastic substrates. Each layer contains cross-point diode memory array, and sensing of the data stored in the array is carried out from a separate integrated circuit remotely from the memory module.

Because PIRM memory is relatively inexpensive, users will likely acquire a large number of PIRM modules with a variety of stored content. It is useful to browse the contents of the modules at a cursory level without having to insert the module into an appliance for a complete directory listing.

Accordingly, a display means is needed to indicate to the user the contents of the memory module. Typically it is important to have the display provide the nature of the data being stored in the memory module. The display may include the title, date of creation, location, type of data, owner and other descriptive information associated with the stored content. The display should also provide a display of the portion of the memory module that has been used, which can be depicted numerically, graphically or by other visual means. Preferably, the display information regarding the amount of memory used can be modified as the amount of stored data changes.

Prior solutions for labeling storage devices with content information all have their drawbacks. Hand-written adhesive backed labels are commonly used for recordable media, such as floppy discs, backup tapes and compact discs. This method is flexible and simple, but its resolution is limited by the user's penmanship, and its accuracy is dependent on the user's diligence in keeping it current.

Labeling photographic film may be accomplished by a small array of LEDs that print the date of the exposure directly on the negative. This approach detracts from the quality of the image and does not enable cursory browsing. Printing on the back of photo prints makes the information more accessible, but the print date is not likely to be the date the snapshot was taken. APS photographic film includes a magnetic tape stripe on the film for writing other forms of meta-data on the negatives. However, browsing is difficult without a scanner.

The tape cartridge for the linear tape open format provides a small amount of nonvolatile solidstate memory for diagnostic and crude directory information. This method avoids having to load and scan an entire tape, but it is still only readable with a machine.

CD rewritable and CD recordable have several content labeling methods, the simplest of which is a hand-written label on the disc. Alternatively, the plastic storage case can contain a printed sheet liner with content information. However, it is difficult to create this case liner and it can be easily separated from the case. CDs can also be labeled directly on the backing, but a complex process is required.

Prior art systems for indicating the used amount of a recording medium also have their limitations. CD-R devices provide a method for observing a subtle change in reflectivity of the disc in the area that has been recorded. However, this approach is so subtle that good lighting is required to determine the difference. APS photographic film provides an externally viewable annunciator that shows whether the film is unexposed, partially exposed, fully exposed or fully exposed and processed. Although this is useful information, the cost to implement the system involves complexity in the film cassette and requires the camera to detect the unexposed film.

Accordingly, there is a need for electronically labeling high density, portable and disposable memory modules to provide and display information about the content of the module and the extent to which the module memory has been used. Such labeling should be automatically carried out, readily visible and capable of displaying a variety of information. The display should also clearly indicate the amount of memory used and/or still available for use.

SUMMARY OF THE INVENTION

The present invention comprises an electrically addressable device for recording, addressing and reading of data, including a storage array unit having multiple layers of data storage medium, each of the layers being disposed on a substratet; and an electrical marking device on at least one of the layers of storage medium of the storage array unit to provide a display indicating pre-selected data or information, such as the nature of the content of the data stored on the storage array unit.

In one embodiment, the electrical marking device comprises at least one layer that is a display layer that is partially visually altered to provide a display of information, such as a display of the subject matter and name of the content of the data and the amount of memory storage that has been used.

The display layer comprises a plurality of information storage cells each representing the value of at least one data bit, wherein the visual appearance of the information storage cell varies depending on the state of the information cell. Each cell is a multiple state electrical device that changes states depending on the value of the data bit and has variable opacity, color and/or reflectivity, depending on the state of the electrical device. A suitable cell is comprised of an electrical fuse that has a modulated opacity depending on whether the fuse has been blown or that has a built-in marker to indicate that a fuse has blown. Preferably, the display layer comprises one of the outermost layers of the storage array unit. The storage array further preferably includes a reflective layer between the display layer and the next layer in the storage array unit.

In another embodiment of the present invention, each of the layers of the storage array device is disposed on a substantially transparent substrate, and the electrical marking device comprises an addressing device for storing the data on the storage array unit in a sequential manner across each layer of the storage array unit. The storage array device has corresponding data addresses at approximately the same location on each layer of the storage array unit and the addressing device simultaneously stores data on multiple layers of the storage array unit at approximately the same location on each layer. A reflective layer may be provided on at least one of the outermost layers of the storage array unit. The display indicates the amount of the memory module that has been recorded with data.

Another embodiment comprises a method for marking the content of an electrically addressable device used for recording, addressing and reading data and having a storage array unit with multiple layers of data storage medium. The method comprises storing data on an outermost layer representative of the content of the data to provide a display indicating the nature of the content of the data stored on the storage array unit. A reflective coating is preferably provided at the interface of the outermost layer and the remaining layers of the storage array unit. The display may indicate any pre-selected information, including but not limited to information about the subject matter and name of the content of the data, as well as the amount of the storage array unit that is recorded with data.

Other aspects and advantages of the present invention will become apparent from the following detailed description, which in conjunction with the accompanying drawings illustrates by way of example the principles of the present invention.

DETAILED DESCRIPTION OF THE PREFERRED EMBODIMENT

Write-once memory circuits, storage systems, addressing and sensing circuits and methods for producing, implementing and using such circuits and systems are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

The present invention comprises an apparatus and methods for marking the content of a memory storage array. A preferred embodiment of this invention will be discussed in the context of a cross-point diode memory array of the type utilized in the memory system described in the aforementioned co-pending U.S. patent application. In order to provide a thorough understanding of the invention, the following detailed description is therefore presented in the context of such a memory system, although those skilled in the art will recognize that the invention is not limited in application to the described structure.

A Write-Once Memory System

Figure 1:
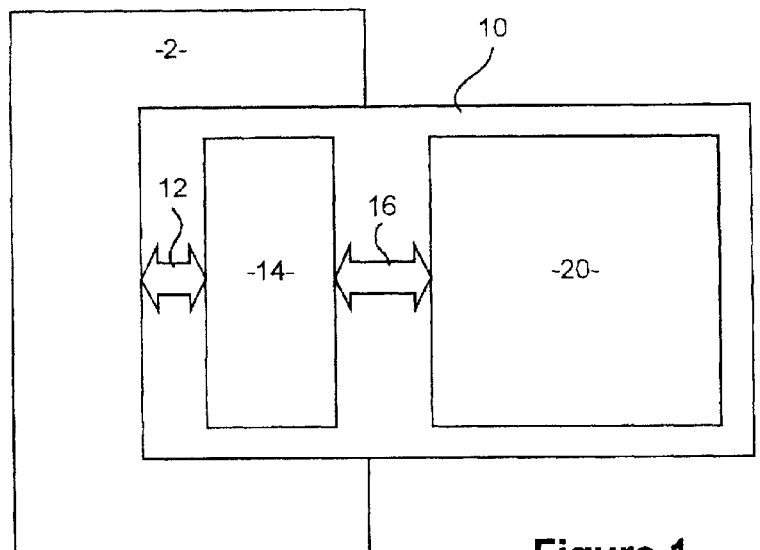
FIG. 1 is a block diagram of a write-once memory system according to an embodiment of the invention.

A portable, inexpensive, rugged memory (PIRM) system that is particularly useful for data storage in applications, such as digital cameras and portable digital audio devices, is embodied by the memory card 10 illustrated in block diagram form in FIG. 1. The memory system may be incorporated into an industry standard portable interface card (e.g. PCMCIA or CF) so that it can be used in existing and future products with such interfaces. The memory card 10 has an I/O interface connector 12 through which communication is made between the card 10 and a device 2 to which it is coupled. The interface connector is coupled to an interface and control circuit 14 that is connected to a removable memory module 20. The memory module 20 provides circuitry for write-once data storage, including some detection, write enabling and addressing functions. The interface and control circuit 14 comprises circuitry for control, interface, detection, error correction coding (ECC) and the like for each removable memory module 20 when it is received in the card. The memory module 20 is received in a socket or the like in the memory card, so that it may be removed therefrom and replaced with another memory module 20. When received in the memory card, the memory module 20 is coupled to the interface and control circuit 14 through an internal interface 16.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1"s, and not the other way around.

Since the memory module 20 contains write-once memory, it is appropriate for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to simply replace the entire memory card 10 in the device 2, however that would mean the interface and control circuitry, as well as the memory card structure, is archived along with the memory module. In order to reduce the data storage costs it is desirable that reusable and relatively expensive components of the memory system not be permanently coupled to the actual storage memory, and for that reason the memory module 20 is removable from the memory card 10 in the preferred embodiment. The bulk of the memory card 10 thus involves a one-off cost, and the memory modules 20 for insertion therein are fabricated inexpensively as discussed further hereinbelow.

A Write-Once Memory Module

Figure 2:
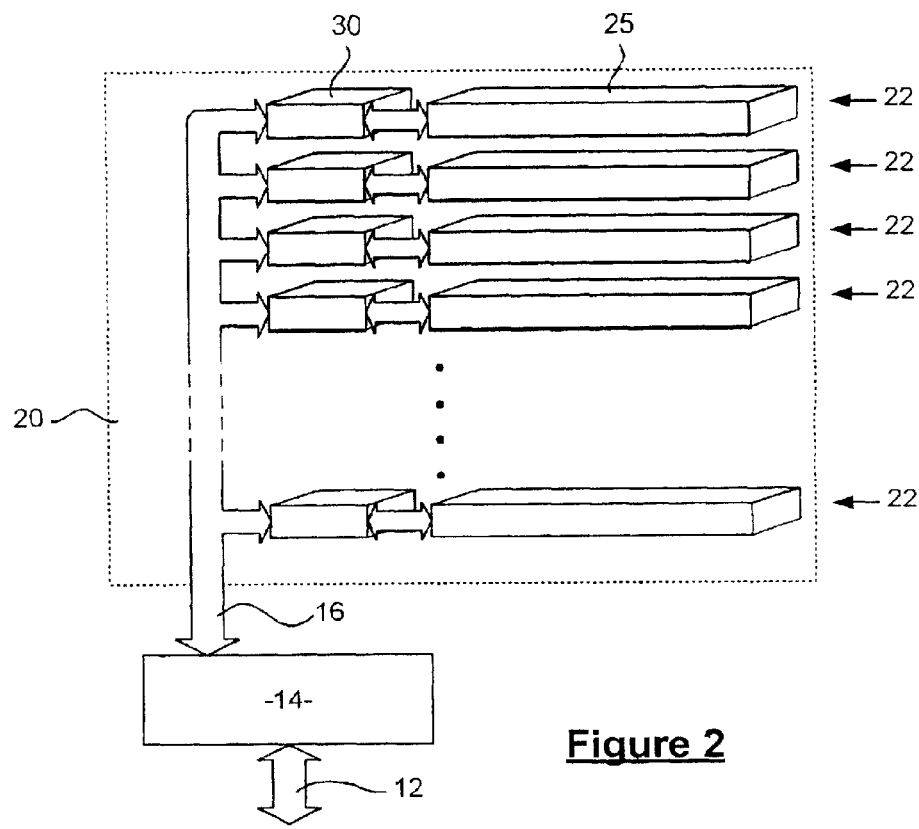
FIG. 2 is a schematic block diagram of the write-once memory system illustrating the general structure of a memory module thereof.

A diagrammatic block representation of a memory module 20 is shown in FIG. 2, coupled to an interface and control circuit 14. In order in increase storage capacity of the memory module for a given base area, the module 20 is constructed from a stack of laminated layers 22. Each layer 22 has an array 25 of memory elements that provide the data storage. The layers also each include addressing circuitry 30 coupling the respective memory arrays through the memory system internal interface 16 to the interface and control circuit 14. The addressing circuitry on each layer enables fewer interconnecting conductors between the layers of the memory module, which facilitates ease of fabrication and thus lowered costs.

Figure 3:
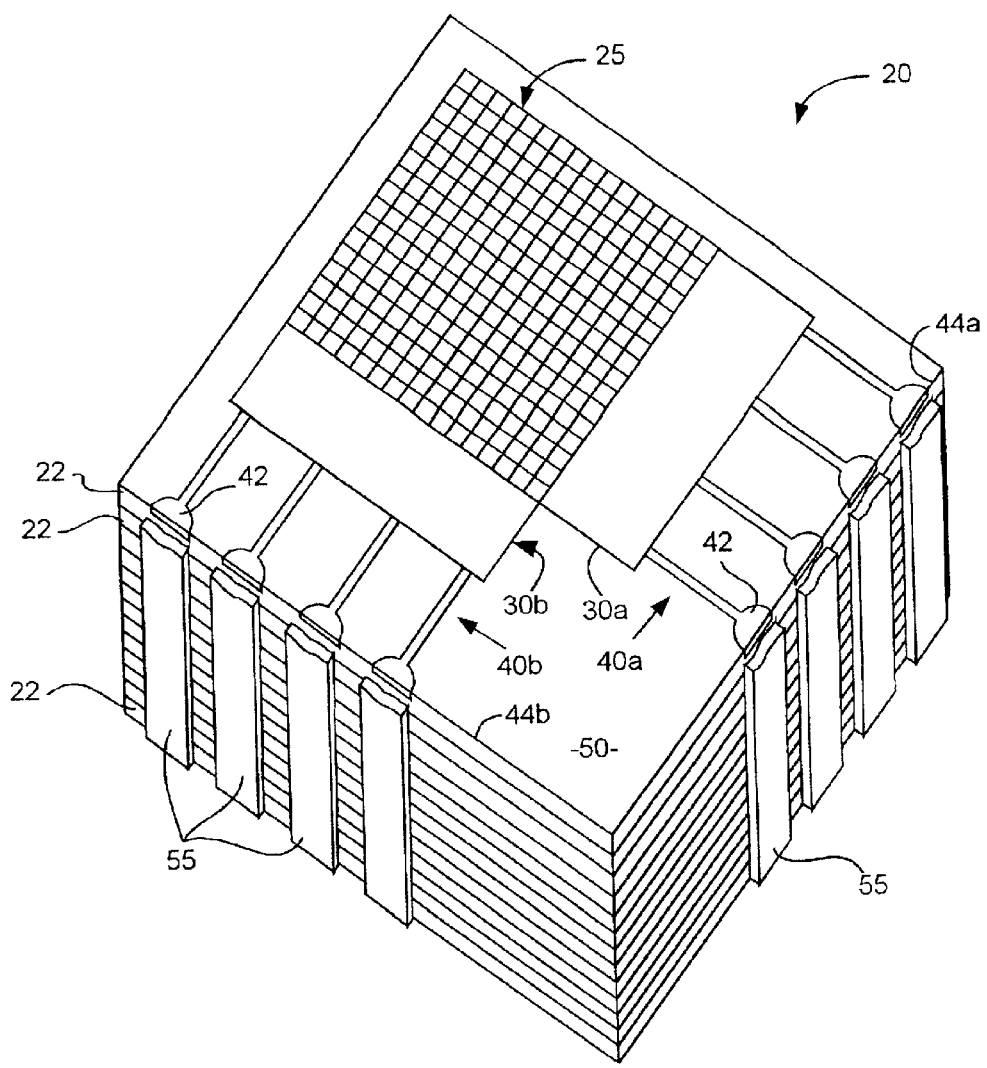
FIG. 3 is a cut-away isometric view of a write-once memory module constructed in accordance with an embodiment of the invention.

FIG. 3 is a cut-away isometric view of a memory module 20, illustrating a possible physical arrangement of circuits and layers in the memory module. Each of the layers 22 comprises a memory array 25 and addressing circuits 30 formed on a substrate 50. The memory array 25 comprises a matrix of memory elements 26. The addressing circuits 30 comprise column and row multiplexing/de-multiplexing (mux/demux) circuit portions that are positioned adjacent respective orthogonal edges of the memory array 25. Input/output (I/O) leads 40 are also formed on the substrate during the fabrication process. In the memory module 20, row I/O leads 40a extend from the row mux/demux circuit 30a to a first adjacent edge 44a of the substrate, and column I/O leads 40b extend from the column mux/demux circuit 30b to a second adjacent edge 44b of the substrate. Each of the leads 40 terminates at respective contact pads 42, portions of which are exposed at the edges 40a and 40b of the substrate 50.

A plurality of layers 22 are stacked in the same orientation and laminated together. Electrical contact is made to the exposed portions of the contact pads 42 of the stacked layers by conductive contact elements 55, which are illustrated in partial cut-away view in FIG. 3. The contact elements 55 extend along the sides of the memory module 20, transverse to the plane of the individual layers 22. Each contact element 55 as illustrated makes electrical contact to a respective contact pads of a plurality of the layers in the stack. The contact elements 55 can be used to couple the memory module 20 through the memory system internal interface 16 to the interface and control circuit 14.

In the preferred implementation of the memory module the substrate 50 for each of the layers 22 is formed from a polymer plastics material. The processes by which the integrated circuits (e.g. memory array and addressing circuitry) can be formed on the substrate, and the layers assembled into a memory module are described in detail in the specification of the aforementioned co-pending U.S. patent application.

A Write-Once Memory Array

Figure 4:
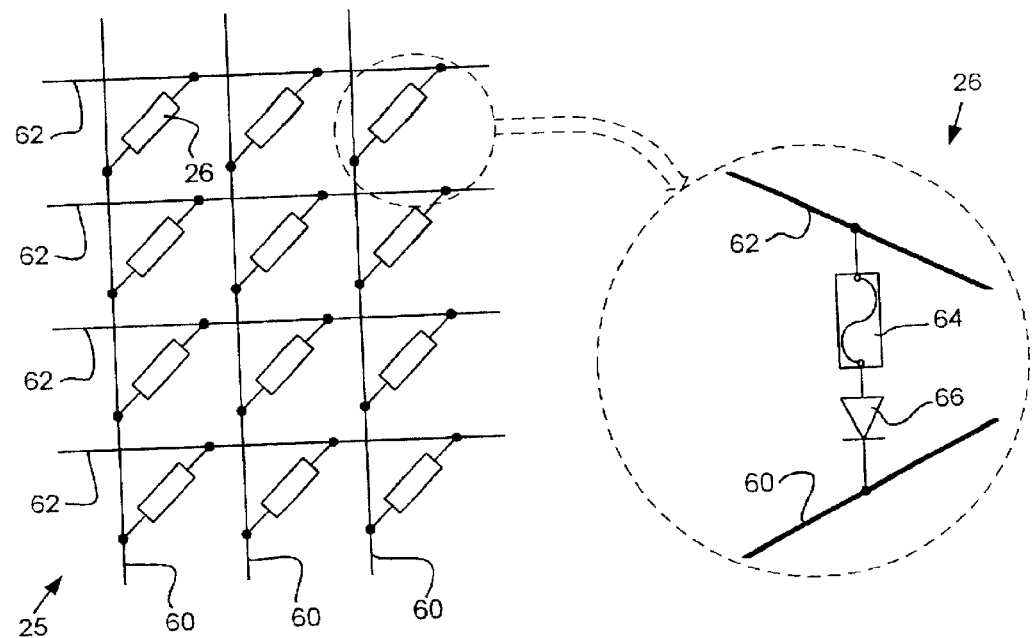
FIG. 4 is a pictorial diagram of a cross-point memory element suitable for implementation in embodiments of the invention.

An array 25 of memory elements 26 is formed on each of the layers in the memory module 20. The memory array comprises a regular matrix of column lines and row lines with a memory element at each column/row intersection. FIG. 4 illustrates a schematic diagram of a portion of a memory array 25 having column lines 60 and row lines 62. Coupled between each of the column lines and row lines is a memory element 26, which is also shown in greater detail in an expanded portion of the diagram in FIG. 4. In the preferred implementation of the memory array, each memory element 26 comprises a fuse element 64 coupled in series with a diode element 66. The fuse element 64 provides the actual data storage effect of the memory element, and the diode 66 facilitates addressing of the memory element using the row and column lines for writing and reading data.

The preferred operation of the memory array 25 is as follows. At fabrication, each of the memory elements 26 has a fuse element 64 that is conductive. The conductive state of the fuse element represents one binary data state, say a data "0". In order to write data to the memory array, each memory element in which it is desired to store a data "1" is addressed using the column and row lines and the fuse element therein is "blown", placing it in a non-conductive state. The non-conductive state of the fuse element represents the other binary data state, say a data "1". Blowing the fuse element is a one-way operation, which makes the memory a "write-once" storage, as discussed hereinabove. A data writing operation (e.g. writing a data "1" to a selected memory element) can be performed by applying a predetermined current through a selected row line to a selected column line, for example, sufficient to blow the fuse of the memory element that directly interconnects those row/ column lines. Data can be read from the memory array by addressing memory elements using the column and row lines and sensing which memory elements are conductive (data "0"s) and which are non-conductive (data "1"s).

The diode element 66 in each memory element 26 of the array assists in addressing the memory elements uniquely using the column and row lines for writing and reading data. Without a diode in the row/column cross-point memory elements there are current paths through many memory elements between a given column line and row line. However, with the diodes element forming a one-way conduction path through each memory element, a single column line and single row line can be used to uniquely address a single memory element. In other words, forming a circuit from one row line to one column line permits current to pass through only a single memory element. By applying a predetermined "data writing" current through that circuit, the fuse in the memory element can be blown to change a data "0" to a data "1". Also, by sensing the resistance in the circuit it is possible to determine whether the memory element fuse has gone into an open circuit or is closed, thereby reading a data "1" or data "0".

Thus, the diodes 66 reduce the incidence of cross-talk between the memory elements in the memory array during reading and writing operations. Furthermore, the non-linear current-voltage (I-V) characteristics of the diodes improves the data sensing signal-to-noise ratio (SNR), which assists in remote sensing and code-word addressing. The data in the memory module is sensed remotely since the sensing circuitry is in the interface and control circuit 14, which is contained in a separate integrated circuit. Also, combinational diode logic addressing of the memory elements is employed, using the addressing circuits as described hereinbelow, in order to reduce the number of connections required between the memory module 20 and the interface and control circuit 14.

Figure 5:
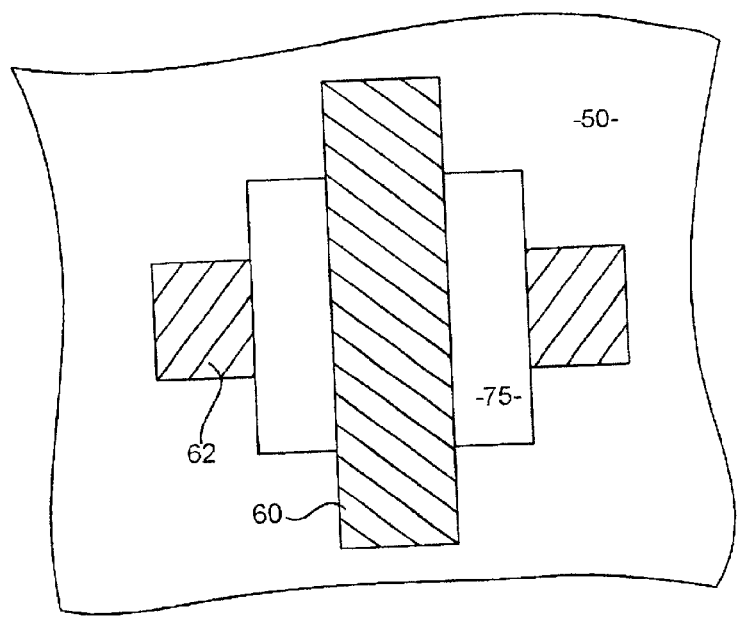
FIG. 5 is a simplified plan view of a cross-point array memory unit cell.

The memory array is sometimes herein referred to as a cross-point array memory in view of the structure thereof, and FIG. 5 provides a simplified plan view of a unit cell of the memory array of the preferred embodiment. The basic structure of the cross-point array memory comprises two layers of orthogonal sets of spaced parallel conductors arranged with a semiconductor layer therebetween. The two set of conductors form row and column electrodes overlaid in such a manner that each of the row electrodes intersects each of the column electrodes at exactly one place. At each of these intersections a connection is made between the row electrode (62 in FIG. 5) and column electrode (60 in FIG. 5) through the semiconductor layer (75 in FIG. 5) that acts in the manner of a diode and a fuse in series. The diodes in the array are all oriented so that if a common potential is applied between all the row electrodes and all the column electrodes then all the diodes will be biased in the same direction. The fuse element may be realized as a separate element that will open circuit when a critical current is passed therethrough or it may be incorporated in the behavior of the diode.

Although commonly in this description the semiconductor layer (e.g. 75) is referred to in the singular, in practice a plurality of layers of different materials may be employed. The layers may include materials that are not semiconductors, such as metals and even dielectrics in various configurations. The materials and structures suitable for implementing the desired functions are described in detail elsewhere.

Figure 6:
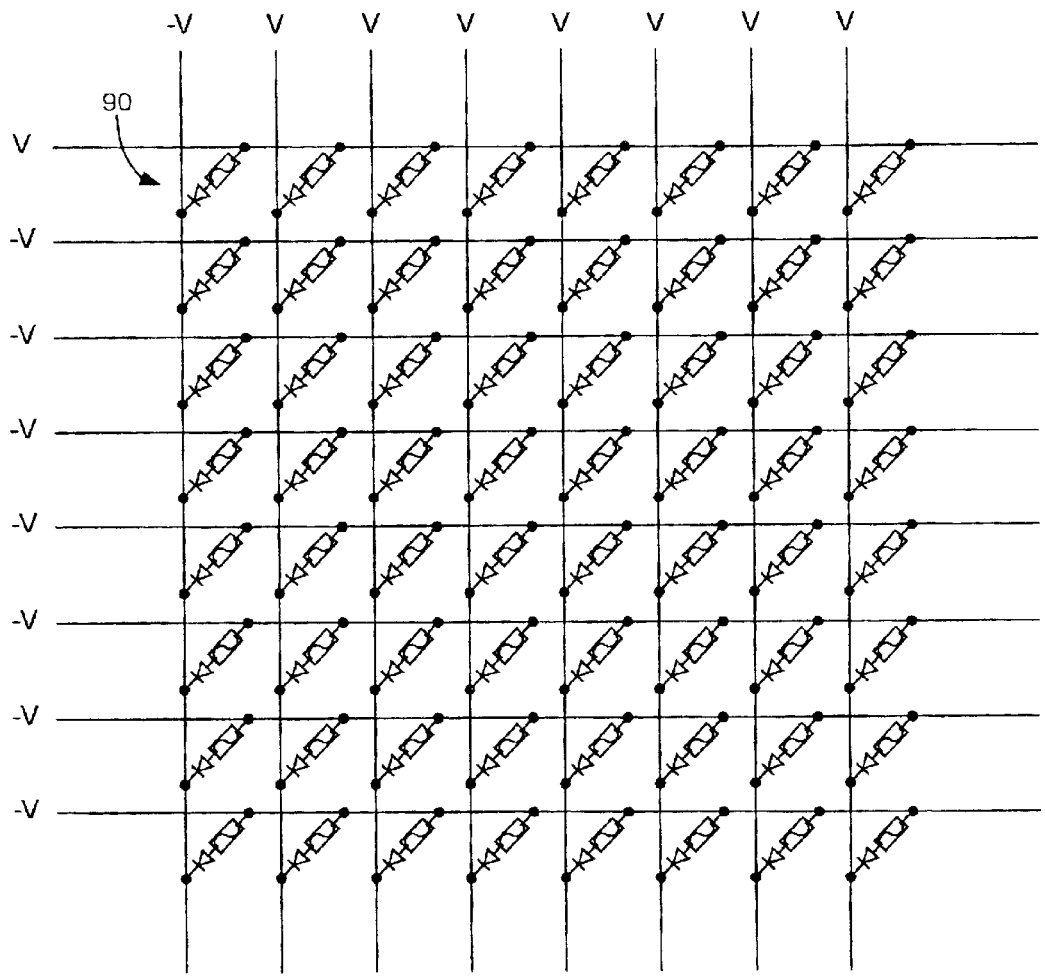
FIG. 6 shows a write-once memory array for illustration of addressing memory elements thereof.

FIG. 6 is a schematic representation of a cross-point write-once diode memory array. The figure shows an eight row by eight column array. If voltages are applied to the row and column electrodes as depicted (i.e. all the column electrodes are a potential V except for one which is at −V, and all the row electrodes are at −V except for one which is at V), then only one diode will be forward biased. For the case depicted in FIG. 6 only the diode (90) in the upper left corner of the array will be forward biased. The diodes in the top row and left-most column will have no bias on them and the remaining diodes in the array will be reverse biased. This constitutes an addressing scheme for the array. If a current flows between the rows and columns with the electrodes at these potentials than the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes more current can be made to flow through the selected diode. If this voltage causes a current that exceeds the threshold current of the fuse then the fuse can be blown, changing the state of the memory element. This constitutes a method for writing to the memory.

The actual current required to blow a fuse in the memory array (or the voltage to be applied to achieve that current) should be predictable and controllable at the time of fabrication. Since it is current density through the memory elements that is the operative factor, the applied voltage/current at which an element will blow can be adjusted by varying the junction area of the element. For example, if the cross-sectional area of the intersection of the cross-point electrodes is reduced this also reduces the current/voltage required to be applied to reach the critical current density to blow the fuse. This scheme can be used in the design and fabrication of the memory circuits to ensure that control voltages can be applied to blow only the desired cross-point fuses.

Fabrication of the PIRM memory module described herein is preferably done in accordance with the methods of fabrication provided in co-pending U.S. patent application Ser. No. 09/875,572, filed on Jun. 5, 2001, entitled "Fabrication Techniques for Addressing Cross-Point Diode Memory Arrays," the disclosure of which is hereby incorporated herein by reference.

A Content Marking System

The foregoing description has provided the context for the present invention. Two preferred embodiments of the present invention shall now be described below: a write-once display and a passive capacity monitor. It is understood that other preferred embodiments or the present invention may be described and shall fall within the scope of the appended claims.

Preferably, the content marking system of the present invention provides that one or more of the layers be made, at least partially from a material that is relatively transparent. The present invention also provides that the fuse material itself, or a marker or dye that are included as part of the fuse, display a change in opacity local to the fuse when the fuse is blown, without otherwise compromising the operation of the device.

Figure 7:
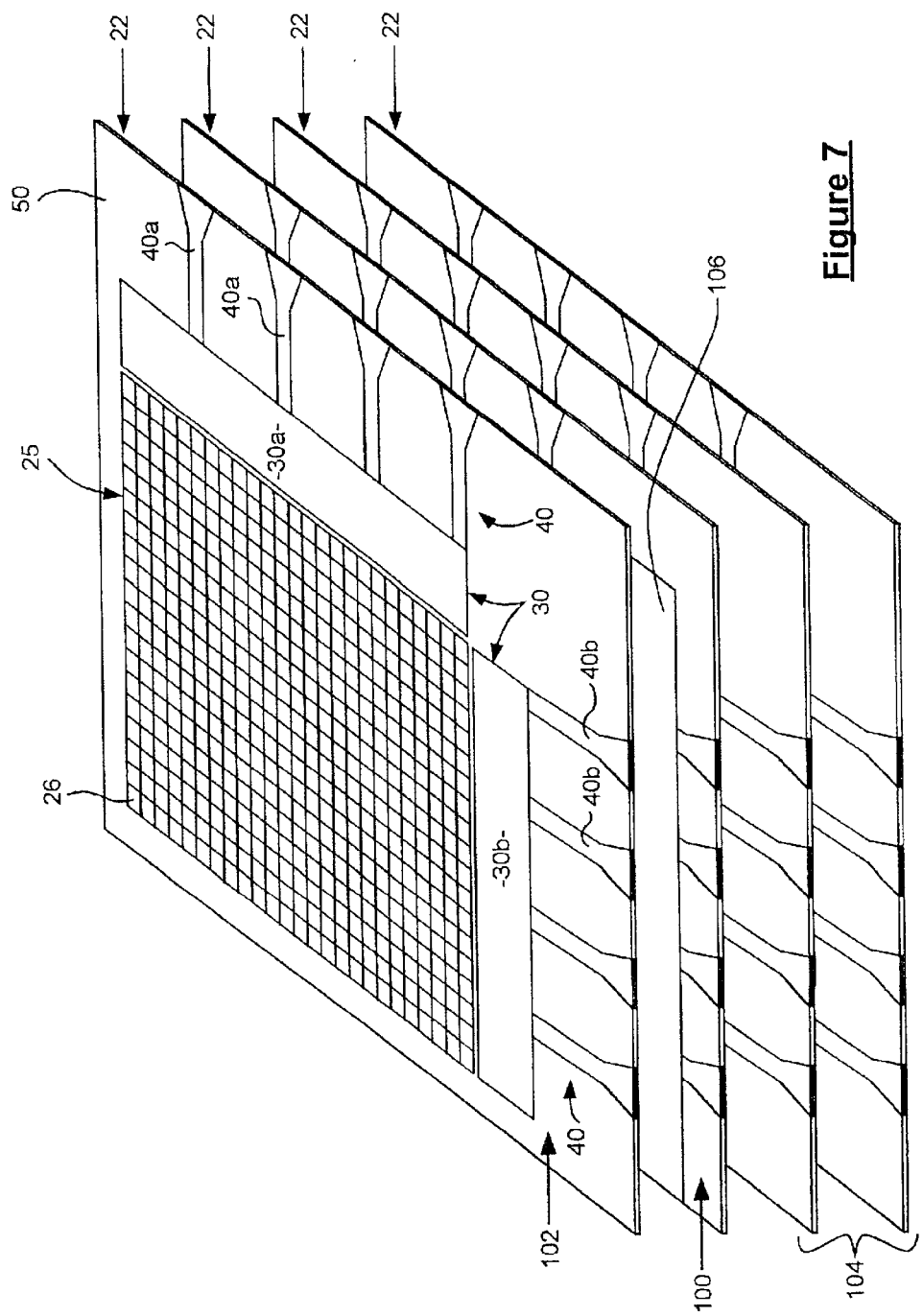
FIG. 7 is an exploded view of layers in a write-once memory module according to an embodiment of the present invention.

Write-Once Display: The write-once display requires the dedication of an outer layer of the memory module as a marking layer for the purpose of providing pre-selected information of any kind, including information about the content of the data stored in the module. Preferably the marking layer rests on a substrate that can be opaque or transparent and is covered by a transparent overlay. Referring now to FIG. 7, a write-once display is constructed by placing a reflective coating 106 at the interface between the outermost layer 102 (either top or bottom) and the remainder of the memory stack 104. The outermost layer 102 is then regarded as a pixilated gray-scale display. Since the bit pitch of the fuse elements is on the order of one micron, several fuses are combined to create a single pixel. This approach enables the possibility of blowing a fraction of the fuses within a pixel to vary the contrast of the pixel with respect to the unwritten background.

Figure 8:
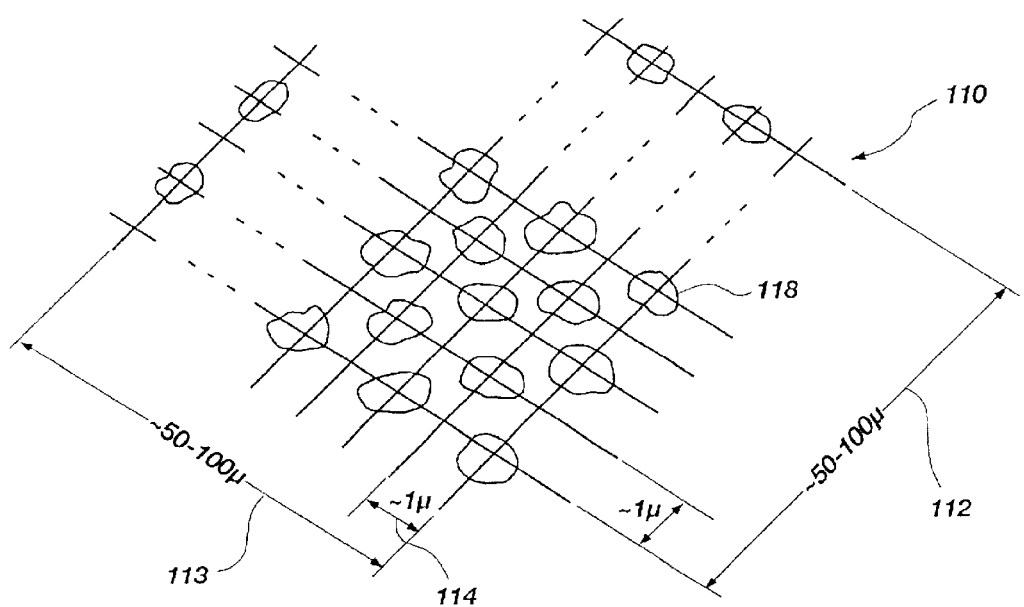
FIG. 8 is a simplified layout of a pixel portion of a display layer of the memory module of FIG. 7.

Looking now at FIG. 8, a pixel portion 110 of the outermost layer 102 provided in FIG. 7 is shown. Pixel portion is preferably a rectangular area having approximately equal pixel resolution dimensions 112 and 113 of about 50 to 100 microns each. As shown, the bit resolution or pitch 114 between fuse elements is only about one micron. Thus, in a pixel of 100 microns square, there could be roughly 10,000 fuse elements. As shown in FIG. 8, about half of the fuse elements 118 have been blown, resulting in roughly a 50% opacity or shade of gray. Because of the large number of fuses in a pixel, many shades of gray may be displayed, enabling the display of a variety of information on the display layer 102.

Figure 9:
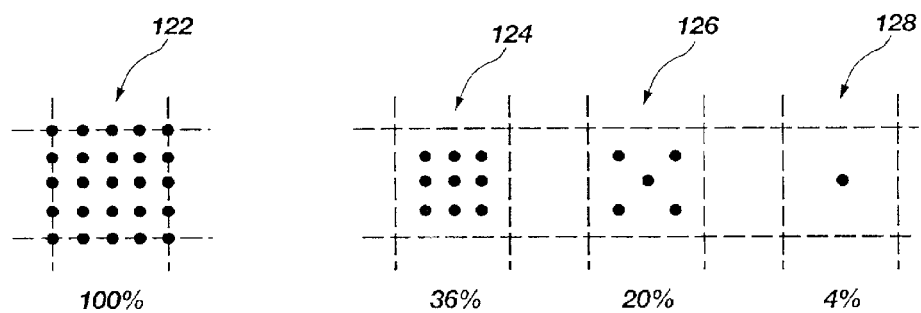
FIG. 9 is a series of depictions of different shades of gray for a pixel of the display layer of the memory module of FIG. 7.

FIG. 9 provides a simplified depiction of different displays of a pixel comprising a 5 by 5 array of fuse devices. As shown at 122, when the fuses are all blown, the darkest color is displayed. At depiction 124, nine of the fuses have been activated, resulting in a 36% gray color. Display 126 shows five fuses blown, resulting in a 20% gray. Depiction 128 shows only one fuse blown, providing a slight 4% shade of gray.

Alternately, the very high resolution of the fuse array may be used to create a display containing a large amount of information, but that would require magnification to be viewed.

It should be understood that other visual appearance features of the fuses or other information storage cells may be modified instead of opacity. Thus, an element may be employed that modifies the color, reflectivity or other visual aspects of the element, depending on the state of the element.

The display is preferably used to present images or text that identify the stored content. The nature of this descriptive data displayed may include, but is not restricted to: date of creation, title, location, genre (video, still, audio, game and so forth), owner, or other descriptive meta-data associated with the stored content. A portion of the display may also be used to graphically represent the fraction of the memory that has been used, such as with a bar graph.

The display memory is addressed, written, and read in the same fashion as the other memory layers. Preferred methods for addressing, reading and writing to the memory module are given in co-pending U.S. patent application Ser. No. 09/875,496, filed Jun. 5, 2001, entitled "Addressing and Sensing a Cross-Point Diode Memory Array," and co-pending U.S. patent application Ser. No. 09/875,828, filed Jun. 5, 2001, now U.S. Pat. No. 6,385,075, granted May 7, 2002, entitled "Parallel Access of Crass-Point Diode Memory Arrays," the disclosures of which are hereby incorporated herein by reference.

Thus, the bitmap of the write-once display is preferably also electronically read and transferred as well. Although the display cannot be re-written, it can be erased by causing all the fuses to go to an open circuit that belong to the pixels within the area to be erased.

Passive Capacity Monitor: This approach does not require the dedication of a layer of the memory module or the use of a reflector coating. Rather, the amount of memory used and the amount remaining can be determined from the appearance of the memory module itself. The substrate used to fabricate the memory layers is preferably made from a material that is relatively transparent. In this embodiment, the rows and columns of each of the layers are laid out in the same order for addressing. The data words or bytes in the memory module are formed using one bit from each memory layer at the same row and column address.

The memory is written in a generally sequential manner, for example writing all the bits in one row and then proceeding to the next row. It should be noted that error correction codes mandate that the data is randomized. Thus, writing a bit only provides a 50% probability that the fuse corresponding to that bit will be blown, since there is a 50% chance that the bit will be a 1 (assuming that a 1 is designated by a blown fuse). Since, according to the present invention, a blown fuse is accompanied by a change in local opacity, one can readily identify the portion of the memory that has been used. It is not necessary that every fuse be blown in the recorded area in order to observe a change in opacity compared to the unwritten portion.

An alternative to the passive capacity monitor embodiment comprises the placement of reflectors on the outmost surfaces of the top and bottom layers of the memory module. Opacity is then viewed through the edge of the memory module in transmission or reflection to determine the fraction of the memory that has had its opacity modulated.

Another alternative embodiment of the present invention comprises combining the write-once display and passive capacity monitor embodiments described above.

Another alternative embodiment utilizes at least some optically transparent conducts in one or more layers of the memory device.

It should also be understood that the scope of the present invention includes displaying any kind or type of information or indicia in a memory cell, whether the information indicates a characteristics of the content of the cell or other information related or not related to the content.

It can be seen from the foregoing that the present invention provides several advantages over prior displays of the content of memory modules. The present invention provides a mechanism for labeling stored content on a recordable memory device automatically because the label information is stored electronically. Further advantages compared to hand labeling are improved legibility, reduced size and direct electronic transfer of the label bitmap. Moreover, the present invention provides the advantage of being collocated with the data and requiring relatively few steps to generate relative to generating labels for CD jewel boxes.

The present invention provides the advantage of being able to be parsed visually, compared to other electronically readable labels, such as FLASH data embedded in a tape cassette. The embodiments of the present invention label a relatively large block of memory content, compared to other methods such as providing markings on photographic negatives or prints, thus improving browsing efficiency.

In particular, the passive capacity monitor requires no additional use of the memory module storage, a considerable advantage over many prior content display methods, such as the APS photography system.

The principles of the present invention can be applied with many other variations to the circuits, structures, arrangements and processes described herein, as will be apparent to those of ordinary skill in the art, without departing from the scope of the invention as defined in the appended claims.

We claim:

1. An electrically addressable device for recording, addressing and reading of data, comprising:

a storage array unit having multiple layers of data storage medium, each of said layers being mounted on a substrate;

an electrical marking device associated with at least one of the multiple layers of data storage medium of the storage array unit to provide a display indicating pre-selected information;

at least one display layer of the multiple layers of data storage medium, said display layer being partially visually alterable to provide said display; and the pre-selected information comprising information about at least one subject matter and name of the content of the data.

2. The electrically addressable device as recited in claim 1, wherein the display layer further comprises a plurality of multiple-state information storage cells each representing a value of at least one data bit, wherein the visual appearance of each information storage cell varies depending on the state of the information storage cell.

3. The electrically addressable device as recited in claim 2, wherein the visual appearance of each information storage cell is changed by varying the opacity of the information storage cell.

4. The electrically addressable device as recited in claim 2, wherein the visual appearance of each information storage cell is changed by varying the reflectivity of the information storage cell.

5. The electrically addressable device as recited in claim 2, wherein the visual appearance of each information storage cell is changed by varying the color of the information storage cell.

6. The electrically addressable device as recited in claim 1, wherein the information storage cells each further comprising a multiple state electrical device which changes states depending on the value of the data bit and having variable visual appearance depending on the state of the electrical device.

7. The electrically addressable device as recited in claim 6, wherein the electrical device includes an electrical fuse that has a modulated visual appearance, depending on whether the fuse has gone to an open circuit.

8. The electrically addressable device as recited in claim 7, wherein the electrical fuse includes a visual marker that is activated to change the visual appearance of the electrical fuse when the fuse is blown.

9. The electrically addressable device as recited in claim 1, wherein the display layer comprises an outermost layer of the storage array unit.

10. The electrically addressable device as recited in claim 9, wherein the substrate for the display layer is substantially opaque.

11. The electrically addressable device as recited in claim 9, and further comprising a reflective layer between the display layer and a next layer in the storage array unit.

12. The electrically addressable device as recited in claim 1, wherein the pre-selected information indicates the nature of the content of the data stored on the storage array unit.

13. An electrically addressable device for recording, addressing and reading of data, comprising:

a storage array unit having multiple layers of data storage medium, each layer comprising a plurality of bi-state electrical devices arranged in orthogonal matrix and a plurality of conductors provided in a substantially orthogonal relationship on each layer;

a plurality of substrates on which the layers are disposed; and an electrical marking device on at least one of the layers of storage medium of the storage array unit comprising a plurality of the bi-state electrical devices disposed to provide a display indicating pre-selected information, depending on the state of each of the electrical devices, and wherein the electrical marking device comprises an addressing device for storing the data on the storage array unit sequentially across each layer of the storage array unit, wherein the display indicates the amount of storage array unit that has been recorded with data.

14. The electrically addressable device as recited in claim 13, wherein each of the electrical bi-state devices comprises a write-once device.

15. The electrically addressable device as recited in claim 13, wherein the display indicates information about the nature of the content of data stored on the storage array unit.

16. The electrically addressable device as recited in claim 13, wherein each of the electrical bi-state devices comprises a fuse device.

17. The electrically addressable device as recited in claim 13, wherein the storage array device has corresponding data addresses at an approximately similar relative location on each layer of the storage array unit and wherein the addressing device simultaneously stores data on multiple layers of the storage array unit at approximately the same relative location on each layer.

18. The electrically addressable device as recited in claim 17, and further comprising a reflective layer on at least one of the outermost layers of the storage array unit.

19. The electrically addressable device as recited in claim 18, and further comprising a first reflector disposed above a plurality of pre-selected layers of data storage medium and a second reflector disposed below the pre-selected layers of data storage medium.

20. A method for marking the content of an electrically addressable device used for recording, addressing and reading of data, and having a storage array unit with multiple layers of data storage medium, each mounted on a substrate, comprising:

selecting at least one outermost layer of data storage medium as a display layer;

disposing a reflective coating at an interface of the display layer and remaining layers of the storage array unit;

electrically storing data on the outermost layer to provide a display indicating pre-selected information; and electrically addressing the device for storing the data on the storage array unit sequentially across each layer of the storage array unit, wherein the display indicates the amount of storage array unit that has been recorded with data.

21. The method of marking as recited in claim 20, wherein the display indicates information about the content of the data.

* * * * *